United States Patent
Hopper et al.

(10) Patent No.: US 6,429,121 B1
(45) Date of Patent: *Aug. 6, 2002

(54) METHOD OF FABRICATING DUAL DAMASCENE WITH SILICON CARBIDE VIA MASK/ARC

(75) Inventors: Dawn M. Hopper; Ramkumar Subramanian, both of San Jose; Richard J. Huang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/778,102

(22) Filed: Feb. 7, 2001

(51) Int. Cl.$^7$ .......................................... H01L 21/4763
(52) U.S. Cl. ....................... 438/636; 438/637; 438/638
(58) Field of Search ................ 438/636, 637, 438/638

(56) References Cited

U.S. PATENT DOCUMENTS 5,710,067 A * 1/1998 Foote et al. ................ 438/636
6,080,529 A * 6/2000 Ye et al. ..................... 430/318
6,184,128 B1 * 2/2001 Wang et al. ................ 438/637
6,218,292 B1 * 4/2001 Foote ......................... 438/636

FOREIGN PATENT DOCUMENTS

WO    2000194988 A * 4/2000

\* cited by examiner

Primary Examiner—John F. Niebling
Assistant Examiner—Lynne A. Gurley

(57) ABSTRACT

A silicon carbide via mask/ARC is formed in implementing trench first-via last dual damascene techniques with an attendant improvement in dimensional accuracy and increased efficiency. Embodiments include forming a silicon carbide mask having an extinction coefficient (k) of about –0.2 to about –0.5 on a first dielectric layer overlying a metal feature, depositing a second dielectric layer, etching a trench in the second dielectric layer stopping on the silicon carbide via mask and then etching a via in the first dielectric layer. Embodiments further include Cu and Cu alloy dual damascene methodology.

20 Claims, 6 Drawing Sheets

METHOD OF FABRICATING DUAL DAMASCENE WITH SILICON CARBIDE VIA MASK/ARC

TECHNICAL FIELD

The present invention relates to semiconductor devices having accurately dimensioned interconnection patterns. The present invention is particularly applicable to ultra large-scale integrated (ULSI) circuit devices having features in the deep sub-micron regime.

BACKGROUND ART

As integrated circuit geometries continue to plunge into the deep sub-micron regime the requirements for dimensional accuracy become increasingly difficult to satisfy. Integration technology is considered one of the most demanding aspects of fabricating ULSI devices. Demands for ULSI semiconductor wiring require increasingly denser arrays with minimal spacings between narrower conductive lines. Implementation becomes problematic in manufacturing semiconductor devices having a design rule of about 0.12 micron and under.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via hole is typically formed by depositing an interlayer dielectric (ILD) on a conductive level comprising at least one conductive feature, forming an opening through the ILD by conventional photolithographic and etching techniques, and filling the opening with a conductive material. Excess conductive material or the overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact hole or via hole section in communication with an upper trench section, which opening is filled with a conductive material, typically a dual, to simultaneously form a conductive plug in electrical contact with an upper conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), titanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

The dielectric constant of materials currently employed in the manufacture of semiconductor devices for an interlayer dielectric (ILD) ranges from about 3.9 for dense silicon dioxide to over 8 for deposited silicon nitride. The value of a dielectric constant expressed herein is based upon a value of one for a vacuum. In an effort to reduce interconnect capacitance, dielectric materials with lower values of permitivity have been explored. The expression "low-k" material has evolved to characterize materials with a dielectric constant less than about 3.9, e.g., about 3.5 or less. One type of low-k material that has been explored are a group of flowable oxides which are basically ceramic polymers, such as hydrogen silsesquioxane (HSQ). HSQ-type flowable oxides have been considered for gap filling between metal lines because of their flowability and ability to fill small openings.

There are several organic low-k materials, typically having a dielectric constant of about 2.0 to about 3.8, which offer promise for use as an ILD. Organic low-k materials which offer promise are carbon-containing dielectric materials such as FLARE 2.0™ dielectric, a poly(arylene)ether available from Allied Signal, Advanced Microelectronic Materials, Santa Clara, Calif., BCB (divinylsiloxane bis-benzocyclobutene) and Silk™ an organic polymer similar to BCB, both available from Dow Chemical Co., Midland, Mich.

Cu interconnect technology, by and large, has been implemented employing damascene techniques, wherein an ILD, such as a silicon oxide layer, e.g., derived from tetraethyl orthosilicate (TEOS) or silane, or a low-k material, is formed over an underlying metal level containing metal features, e.g., Cu or Cu alloy features with a silicon nitride capping layer. A damascene opening, e.g., via hole, trench, or dual damascene opening, is then formed in the ILD. A barrier layer and optional seedlayer are then deposited, followed by Cu deposition, as by electrodeposition or electroless deposition.

In implementing conventional dual damascene techniques wherein the trench is formed before forming the via (trench first-via last), a via mask, which also serves as an etch stop, is formed on a first dielectric layer overlying capped metal feature. The via mask typically formed of silicon oxide, silicon nitride or silicon oxynitride, and is chosen for its high etch selectivity with respect to the overlying second dielectric layer which is then deposited on the via mask/etch stop layer. A photoresist mask is then formed over the second dielectric layer, and anisotropic etching is conducted to form a trench through the second dielectric layer stopping on the via mask/etch stop layer and to form a via hole through first dielectric layer. However, the via mask/etch stop layer exhibits relatively poor anti-reflective properties, thereby reducing the dimensional accuracy of the resulting interconnection.

As miniaturization proceeds apace with an attendant shrinkage in the size of metal lines, e.g., metal lines having a width of about 0.3 micron and under, e.g., about 0.2 micron and under, it becomes increasingly difficult to achieve the requisite dimensional accuracy of the metal lines, particularly when implementing dual damascene techniques. Accordingly, there exists a need for interconnection methodology enabling the formation of metal features, such as metal lines, with high dimensional accuracy. There exists a particular need for dual damascene methodology enabling the formation of accurately dimensional metal lines having a width of about 0.3 micron and under, e.g., about 0.2 micron and under.

SUMMARY OF THE INVENTION

An advantage of the present invention is a semiconductor device comprising an interconnection pattern with high dimensional accuracy.

Another advantage of the present invention is a method of manufacturing a semiconductor device comprising an interconnection pattern with accurately dimensioned metal lines.

Additional advantages and features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer on a capping layer overlying a lower metal feature of a lower metal level; forming a silicon carbide via mask/anti-reflective coating (ARC) on the first dielectric layer; forming a second dielectric layer on the silicon carbide via mask/ARC; and etching to form: a trench through the second dielectric layer stopping on the silicon carbide via mask/ARC; and a via hole through the silicon carbide etch stop layer/ARC and through the first dielectric layer exposing a portion of the capping layer.

Embodiments of the present invention include chemical vapor depositing a layer of silicon carbide, having an extinction coefficient (k) of about −0.2 to about −0.5, on the first dielectric layer, forming a photoresist mask on the silicon carbide layer, etching an opening in the silicon carbide layer to form the silicon carbide via mask/ARC, forming a photoresist mask on the second dielectric layer and etching to form a dual damascene opening comprising the trench communicating with the underlying via hole. Embodiments of the present invention also include the use of a silicon carbide capping layer/ARC on the underlying metal feature and the use of low-k dielectric layers. After depositing a suitable barrier metal layer and seedlayer, Cu or a Cu alloy is deposited, as by electrodeposition or electroless deposition. CMP is then conducted followed by deposition of a suitable capping layer, such as silicon nitride. As employed throughout this disclosure, the symbol Cu is intended to encompass high purity elemental copper as well as Cu-based alloys, such as Cu alloys containing minor amounts of tin, zinc, manganese, titanium, germanium, zirconium, strontium, palladium, magnesium, chromium and tantalum.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and descriptions are to be regarded as illustrative in nature and not as restrictive.

BRIEF DESCRIPTION OF THE DRAWINGS

In FIGS. 1 through 6, similar features are denoted by similar reference numerals.

DESCRIPTION OF THE INVENTION

Figure 1:
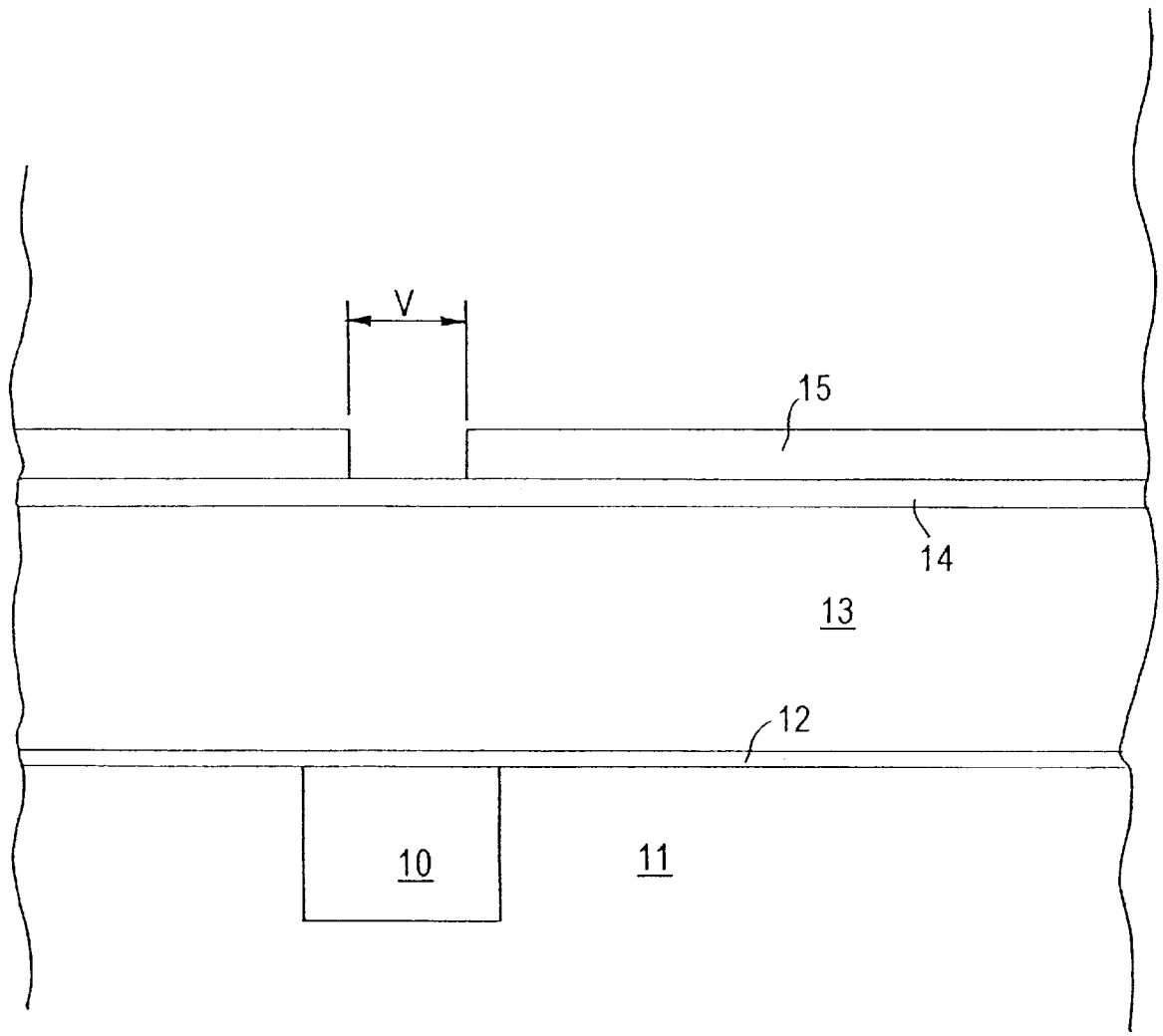
FIGS. 1 through 6 schematically illustrate sequential phases of a method in accordance with an embodiment of the present invention.

The present invention enables the formation of semiconductor devices having interconnection patterns with improved dimensional accuracy, such as accurately dimensioned metal lines, e.g., Cu lines, having a width of about 0.3 micron and under, e.g., about 0.2 micron and under. This objective is achieved by the strategic use of silicon carbide as a combined via mask and ARC in implementing dual damascene processing, particularly trench first-via last techniques.

Silicon oxide, silicon nitride and silicon oxynitride have previously been used as a via mask, selected primarily for their etch stopping ability with respect to the overlying dielectric material in which the trench is formed. However, these materials typically have an extinction coefficient (k) of about −0.7 to about −1.1, e.g., about −1.1. Accordingly, these materials do not exhibit the anti-reflective properties necessary to achieve high dimensional accuracy in patterning metal lines, particularly metal lines having a width of about 0.3 micron and under, e.g., about 0.2 micron and under. For example, silicon oxynitride has an extinction coefficient (k) of about −0.7 to about −1.1. This problem becomes particularly acute as design requirements for the width of the metal line plunges into the deep sub-micron regime, e.g., below about 0.3 micron and under, e.g., about 0.2 micron and under.

In accordance with embodiments of the present invention a silicon carbide is strategically employed as a combined via mask/ARC in implementing dual damascene techniques, particularly trench first-via last dual damascene techniques. Silicon carbide can be deposited such that it exhibits an extinction coefficient (k) of about −0.2 to about −0.5, by chemical vapor deposition.

Advantageously, the use of silicon carbide as a via mask/ARC exhibiting superior anti-reflective properties vis-à-vis conventional silicon nitride or silicon oxynitride via masks, enables a significant improvement in the dimensional accuracy of the resulting metal line. In addition to its superior anti-reflective properties, silicon carbide exhibits high etch selectivity with respect to dielectric materials used to form the overlying dielectric layer in which the trench is formed. Advantageously, silicon carbide having superior anti-reflective properties can also be used as a capping layer/ARC for the underlying metal features, such as Cu.

A wide variety of dielectric materials can be employed for dielectric layers in accordance with embodiments of the present invention, particularly low-k materials including various polyimides, BCB, FLARE™, Silk™, and Black-Diamond™ dielectrics. Other suitable low-k dielectrics include poly(arylene)ethers, poly(arylene)ether azoles; parylene-N, polyimides, polynapthalene-N, polyphenylquinoxalines (PPQ), polybenzoxazoles, polyindane, polynorbene, polystyrene, polyphenyleneoxide, polyethylene and polypropylene. It was found particularly suitable to employ SiCOH which exhibits a dielectric constant of about 3 and typically contains silicon in an amount of about 15 to about 18 at. %, e.g., about 17 at. %, oxygen in an amount of about 28 to about 30 at. %, e.g. about 29 at. %, carbon in an amount of about 16 to about 18 at. %, e.g., about 17 at. % and hydrogen in an amount of about 36 to about 38 at. %, e.g., about 37 at. %. SiCOH contains SiC, SiH, CH and SiOH bonding.

In accordance with embodiments of the present invention, the resulting dual damascene opening can be filled with any suitable metal, such as Cu. In implementing Cu damascene methodology, a barrier layer and seedlayer are typically sequentially deposited prior to depositing Cu, as by electrodeposition or electroless deposition. CMP is then typically conducted such that the upper surface of the filled trench is substantially coplanar with the upper surface of the second dielectric layer. A capping layer, such as silicon nitride, or another layer of silicon carbide exhibiting superior anti-reflective properties, is then deposited. Advantageously, the use of silicon carbide as a via mask/ARC improves dimensional accuracy by about 50% or more vis-à-vis the use of conventional via mask materials, such as silicon nitride and silicon oxynitride. The silicon carbide via mask/ARC of the present invention can be deposited at a suitable thickness, such as about 200 Å to about 800 Å, e.g., about 300 Å to about 500 Å.

An embodiment of a method in accordance with the present invention is schematically illustrated in FIGS. 1 through 6. Adverting to FIG. 1, a first dielectric layer 13, e.g., comprising a low-k material, is formed over an underlying layer 11 having a metal feature 10, such as an underlying metal line, e.g., Cu. A capping layer 12, such as silicon nitride, or silicon carbide having superior anti-reflective properties, e.g., an extinction coefficient (k) of about −0.2 to about −0.5, is formed on underlying layer 11 and feature 10. A silicon carbide layer 14, having an extinction coefficient (k) of about −0.2 to about −0.5 is then deposited on first dielectric layer 13 at a suitable thickness, such as about 200 Å to about 800 Å, e.g., about 500 Å. A photoresist mask 15 is then formed on silicon carbide layer 14. Photoresist mask 15 has an opening "V" therein substantially corresponding to the cross sectional width of via hole subsequently formed in dielectric layer 13.

Figure 2:
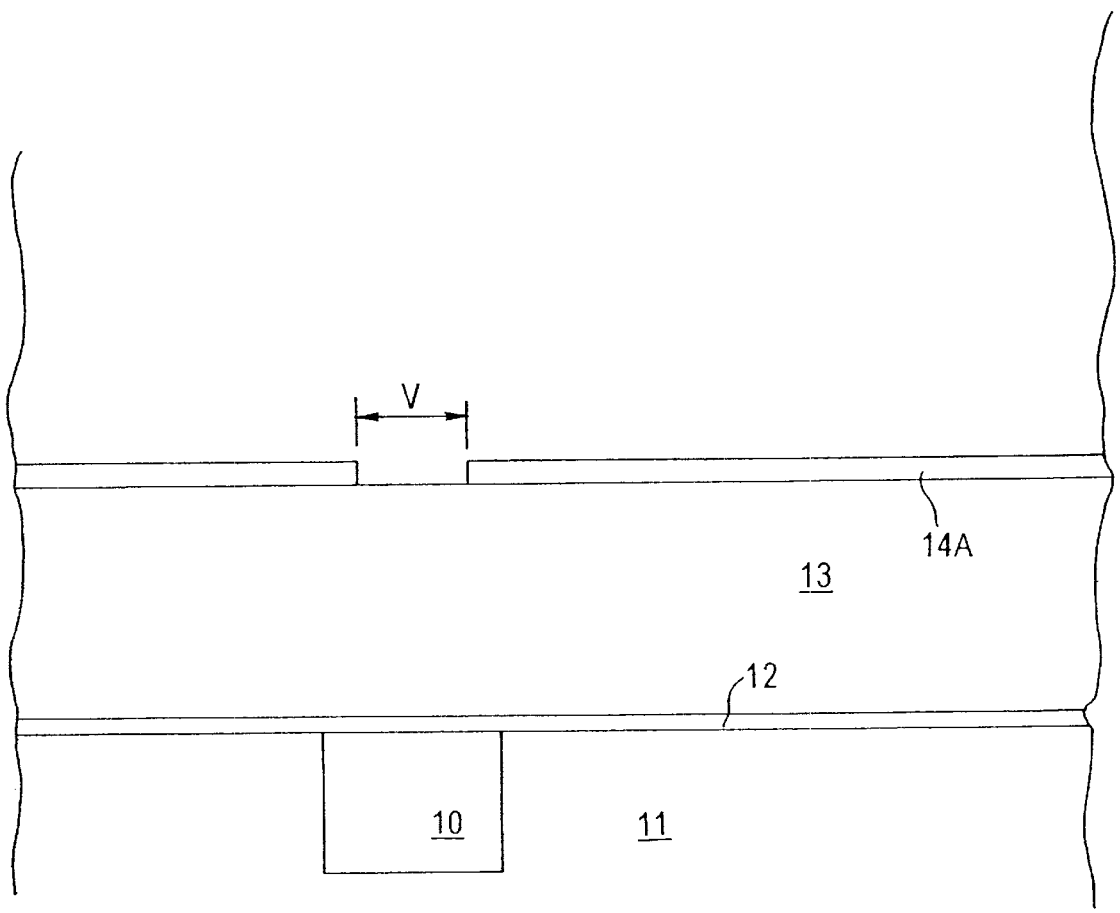
Figure 3:
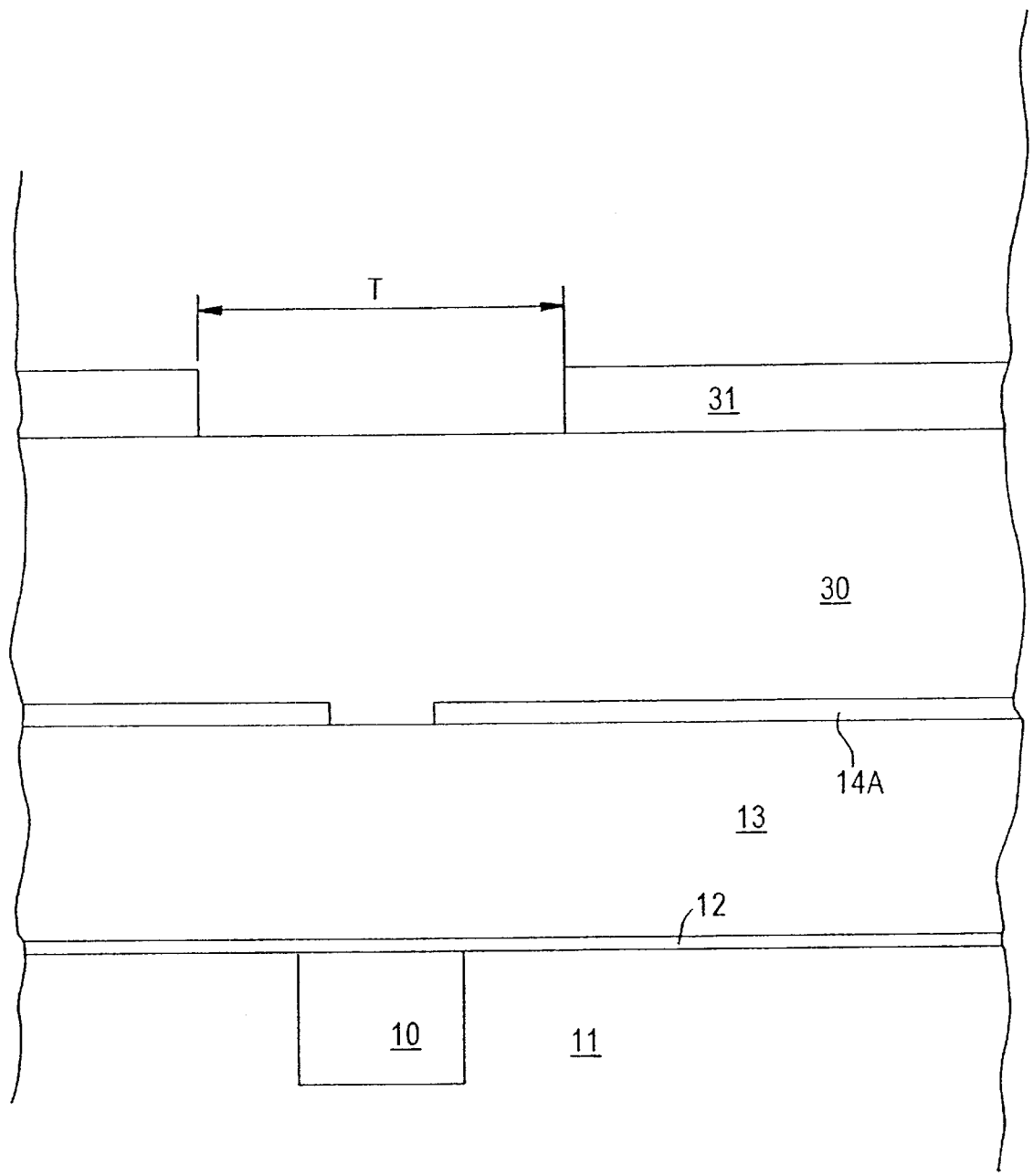

Anisotropic etching is then conducted to form silicon carbide via mask/ARC 14A, having opening "V" therein as shown in FIG. 2. Photoresist mask 15 is then removed in a conventional manner, as by oxygen(O2) ashing. Subsequently, as illustrated in FIG. 3, a second dielectric layer 30, e.g., comprising a low-k material, is deposited on silicon carbide via mask/ARC 14A. A photoresist mask 31 is then formed on dielectric layer 30. Photoresist mask 31 contains an opening "T" substantially corresponding to the width of the trench subsequently formed in dielectric layer 30.

Figure 4:
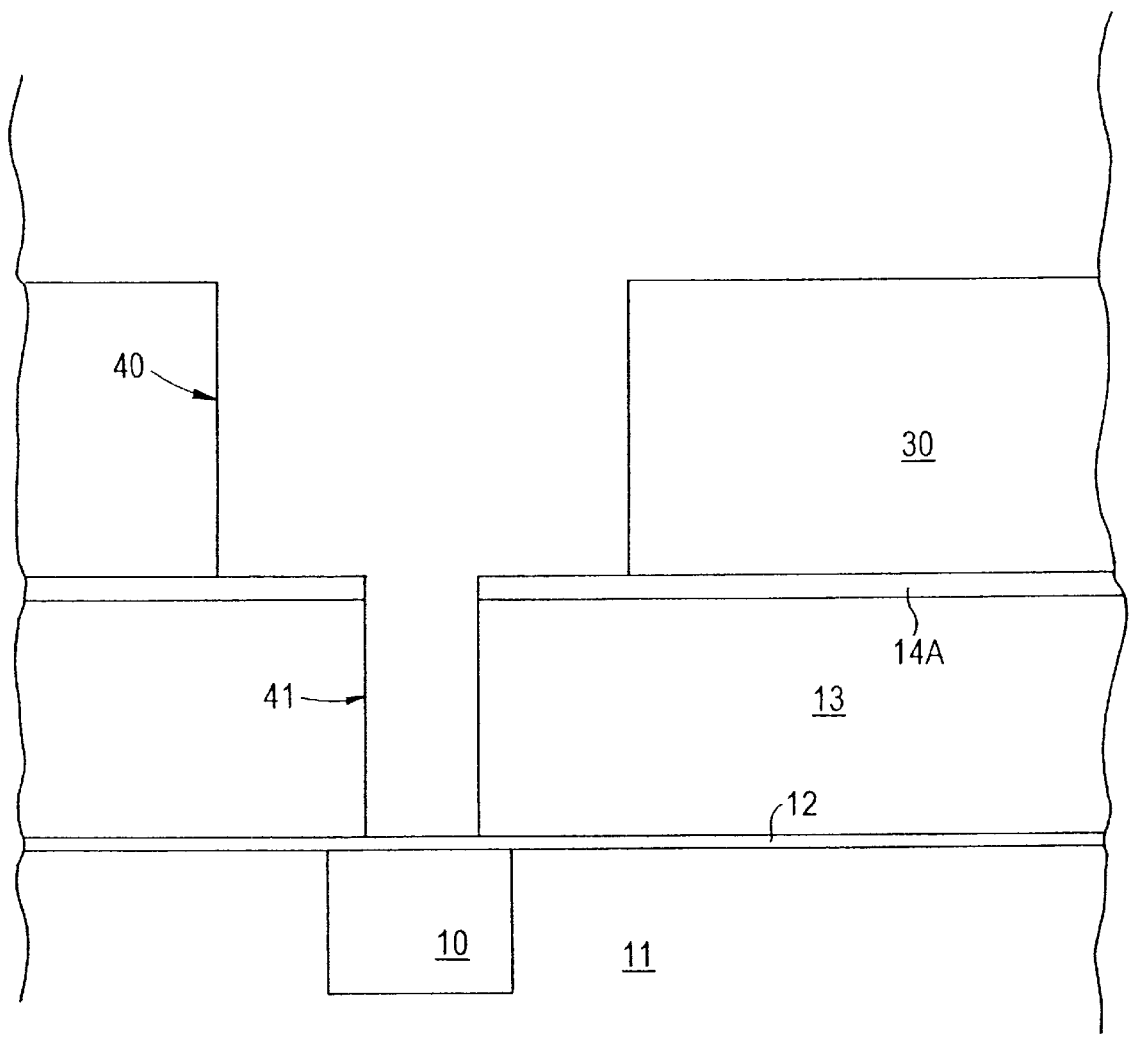
Figure 5:
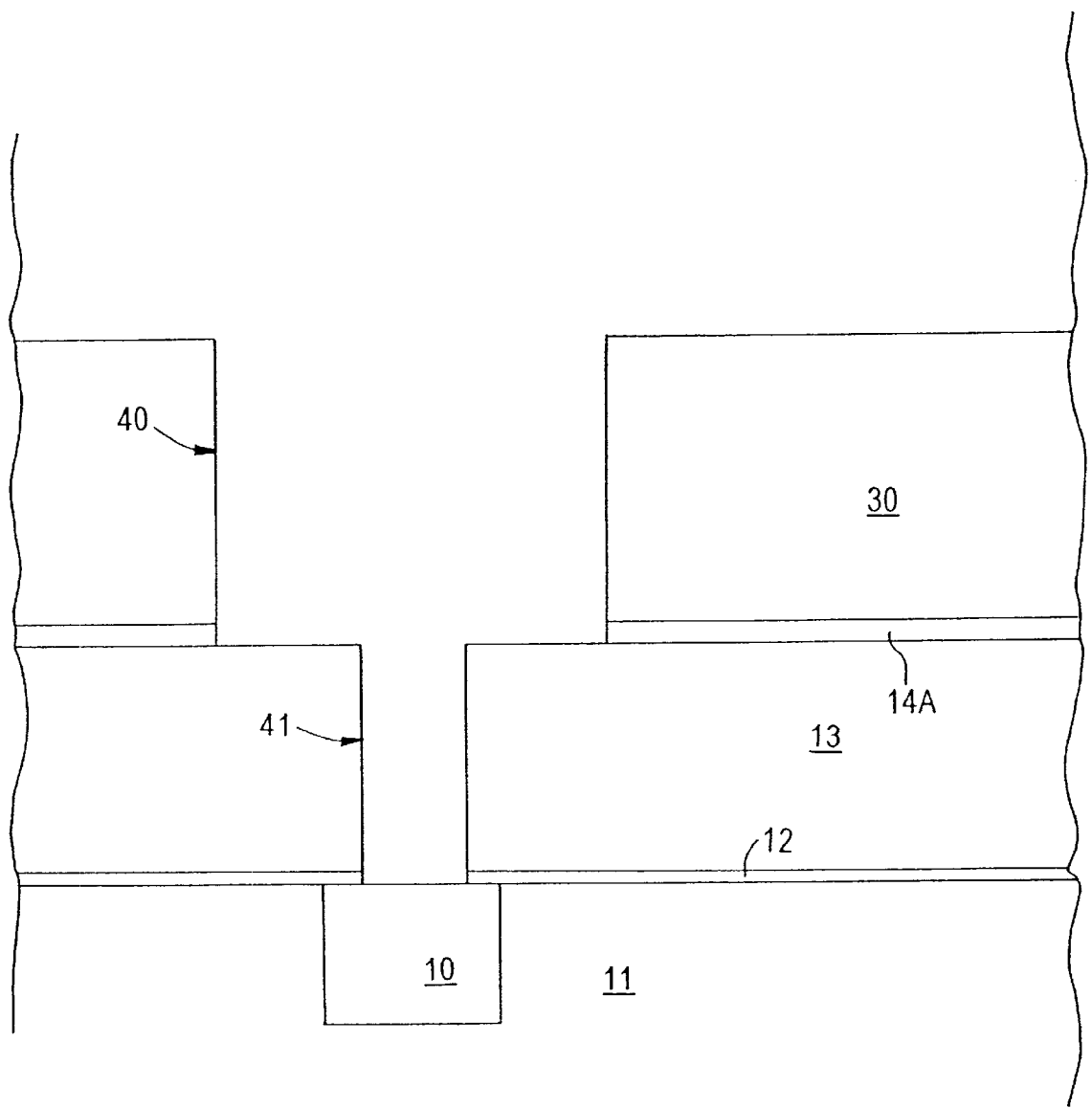
Figure 6:
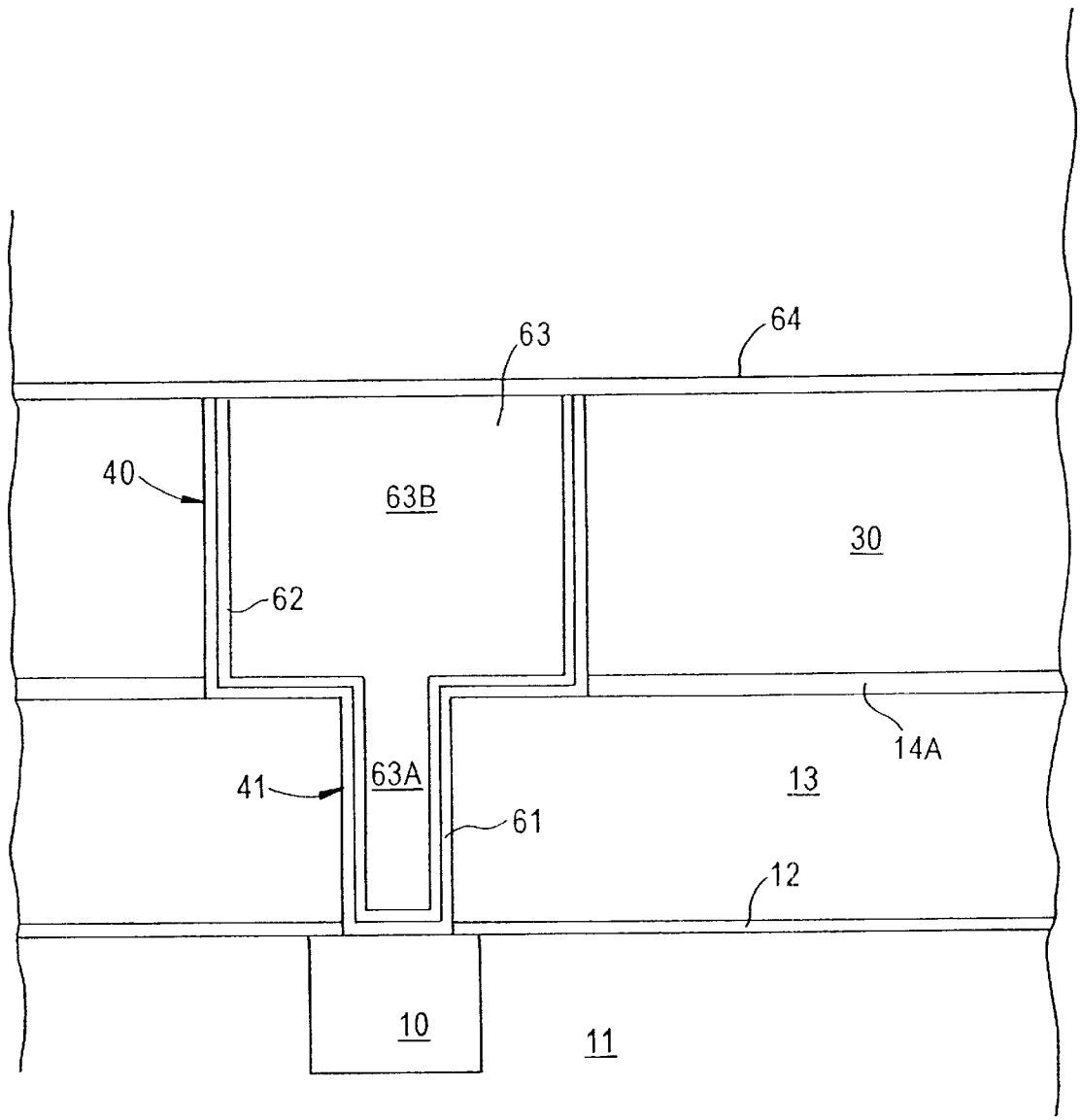

Subsequently, as illustrated in FIG. 4, anisotropic etching is conducted to form a dual damascene opening comprising trench 40 in dielectric layer 30 stopping on silicon carbide via mask/ARC 14A and via hole 41 exposing a portion of capping layer 12. The exposed portions of silicon carbide via mask 14A and capping layer 12 in the dual damascene opening are then removed employing an appropriate etchant, or by sputter etching, as illustrated in FIG. 5.

The use of silicon carbide as a via mask/ARC 14A having a desirable extinction coefficient (k), e.g., about −0.2 to about −0.5, enables the formation of trench opening 40 with accurately formed vertical side surfaces vis-à-vis conventional practices employing a silicon nitride or silicon oxynitride via mask. Advantageously, the use of silicon carbide having such a desirable extinction coefficient (k) of about0.2 to about0.5 for capping layer 12 further improves the dimensional accuracy of via 41.

Subsequently, processing is conducted in a conventional manner, as by depositing metal 63 filling the via hole 41 and trench 40, forming an overburden (not shown), and then implementing CMP such that the upper surface of metal line 63B is substantially coplanar with the upper surface of second dielectric layer 30. Metal line 63B is connected to underlying via 63A which is in electrical contact with underlying metal feature 10. A capping layer 64 is then deposited to encapsulate the inlaid Cu metallization. In depositing Cu to form via 63A and line 63B, as by electrodeposition or electroless deposition, a barrier layer 61 is typically initially deposited to line the dual damascene opening, and a seedlayer 62 is deposited thereon. Typical barrier layers include Ta and TaN, while typical seedlayers include alloys of copper with elements such as magnesium, aluminum, zinc, zirconium, tin, nickel, palladium, gold or silver, in suitable amounts, e.g., about 0.3 to about 12 at. %. Embodiments of the present invention further include forming capping layer 64 of silicon nitride or of silicon carbide having an extinction coefficient (k) of about −0.2 to about −0.5.

The present invention advantageously enables the fabrication of damascene structures in the deep sub-micron regime, e.g., damascene structures comprising metal lines having a width of about 0.3 micron or under, e.g; about 0.2 micron and under, including Cu lines ones. The present invention is particularly applicable to trench first-via last dual damascene techniques.

The present invention enjoys industrial applicability in manufacturing various types of semiconductor devices. The present invention is particularly applicable to manufacturing semiconductor devices with high circuit speeds having design features in the deep sub-micron regime.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed:

1. A method of manufacturing a semiconductor device, the method comprising:

forming a first dielectric layer on a capping layer overlying a lower metal feature of a lower metal level;

forming a silicon carbide via mask/anti-reflective coating (ARC), with an extinction coefficient (k) of about −0.2 to about −0.5, on the first dielectric layer;

forming a second dielectric layer on the silicon carbide via mask/ARC; and etching to form: a trench through the second dielectric layer stopping on the silicon carbide via mask/ARC; and a via hole through the first dielectric layer exposing a portion of the capping layer.

2. The method according to claim 1, further comprising etching to remove exposed portions of the silicon carbide via mask/ARC and the exposed portion of the capping layer.

3. The method according to claim 1, wherein the capping layer comprises silicon carbide.

4. The method according to claim 3, wherein the silicon carbide capping layer has an extinction coefficient (k) of about −0.2 to about −0.5.

5. The method according to claim 1, further comprising:
depositing a layer of silicon carbide on the first dielectric layer;
forming a photoresist mask on the silicon carbide layer;
etching an opening in the silicon carbide layer to form the silicon carbide via mask/ARC;
forming a photoresist mask on the second dielectric layer; and
etching to form the trench and via hole.

6. The method according to claim 1, comprising forming the silicon carbide via mask/ARC at a thickness of about 300 Å to about 500 Å.

7. The method according to claim 1, comprising filling the via opening and trench with a metal to form a via in contact with a metal line.

8. The method according to claim 7 comprising filling the via opening and trench with copper (Cu) or a Cu alloy.

9. The method according to claim 8, comprising depositing a barrier metal layer to line the via opening and trench before depositing the Cu or Cu alloy to fill the via hole and trench.

10. The method according to claim 9, comprising sequentially:
depositing a seedlayer on the barrier metal layer; and
depositing the Cu or Cu alloy by electrodeposition or electroless deposition to fill the via hole and trench.

11. The method according to claim 8, wherein the first dielectric layer comprises a material having a dielectric constant of about 3.5 or less.

12. The method according to claim 11, wherein the second dielectric layer comprises a material having a dielectric constant of about 3.5 or less.

13. The method according to claim 1, wherein the first dielectric layer comprises a material having a dielectric constant of about 3.5 or less.

14. The method according to claim 13, wherein the second dielectric layer comprises a material having a dielectric constant of about 3.5 or less.

15. The method according to claim 1, wherein each of the first and second dielectric layers comprises a material having a dielectric constant of about 3.5 or less.

16. A method of manufacturing a semiconductor device, the method comprising:
forming a first dielectric layer on a capping layer overlying a lower metal feature of a lower metal level;
forming a silicon carbide via mask/anti-reflective coating (ARC) on the first dielectric layer;
forming a second dielectric layer on the silicon carbide via mask/ARC;
etching to form: a trench through the second dielectric layer stopping on the silicon carbide via mask/ARC; and a via hole through the first dielectric layer exposing a portion of the capping layer and;
etching to remove exposed portions of the silicon carbide via mask/ARC and the exposed portion of the capping layer.

17. The method according to claim 16, wherein the capping layer comprises silicon carbide having an extinction coefficient k of about −0.2 to about −0.5.

18. The method according to claim 17, comprising forming the silicon carbide via mask/ARC with an extinction coefficient (k) of about −0.2 to about −0.5.

19. The method according to claim 16, comprising forming the silicon carbide via mask/ARC at a thickness of about 300 Å to about 500 Å.

20. The method according to claim 16, comprising filling the via opening and trench with copper (Cu) or a Cu alloy.

* * * * *